United States Patent
Wang et al.

[11] 3,970,959
[45] July 20, 1976

[54] TWO DIMENSIONAL DISTRIBUTED FEEDBACK DEVICES AND LASERS

[75] Inventors: Shyh Wang, El Cerrito; Sang K. Sheem, Albany, both of Calif.

[73] Assignee: The Regents of the University of California, Berkeley, Calif.

[22] Filed: Dec. 4, 1974

[21] Appl. No.: 529,538

Related U.S. Application Data

[62] Division of Ser. No. 355,454, April 30, 1973, Pat. No. 3,884,549.

[52] U.S. Cl. .................. 331/94.5 C; 350/96 WG
[51] Int. Cl.² .......................................... H01S 3/08
[58] Field of Search ............... 350/96 WG; 331/94.5

[56] References Cited
OTHER PUBLICATIONS

Kogelnik et al., Stimulated Emission in a Periodic Structure, Appl. Phys. Lett., vol. 18, No. 4 (Feb. 15, 1971) pp. 152–154.

Shank et al., Tunable Distributed-Feedback Dye Laser, Appl. Phys. Lett., vol. 18, No. 9 (May 1, 1971), pp. 395–396.

*Primary Examiner*—William L. Sikes
*Attorney, Agent, or Firm*—Flehr, Hohbach, Test

[57] ABSTRACT

Optical devices and waveguides using a thin film optical waveguide having a two dimensional array of perturbations associated therewith or with adjacent optically coupled layers. The array is regular and forms periodic variations in two non-coincident directions which serve to reflect or scatter light waves into controllable transverse modes of propagation. Lasers as well as passive devices are disclosed.

3 Claims, 39 Drawing Figures

CROSS-SECTION OF
A HEMISPHERICAL
SHELL OF RADIUS
$k_0 n_f$ IN A PLANE
CONTAINING
POQ

HEMISPHERICAL
SHELL OF RADIUS
$k_0 n_a$ $\overrightarrow{PR} = r_y \overrightarrow{G_y} + r_y \overrightarrow{G_z}$ WHERE $k_x$ IS = $k_x$ OF FIG.-4

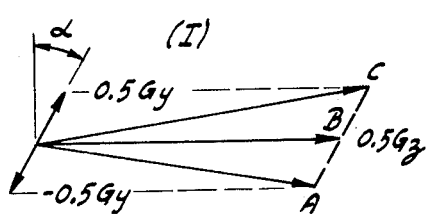
FIG._21A
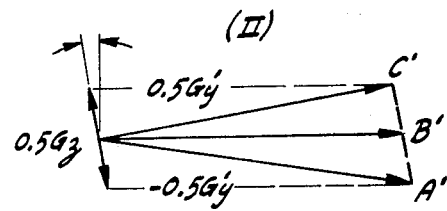
FIG._21B
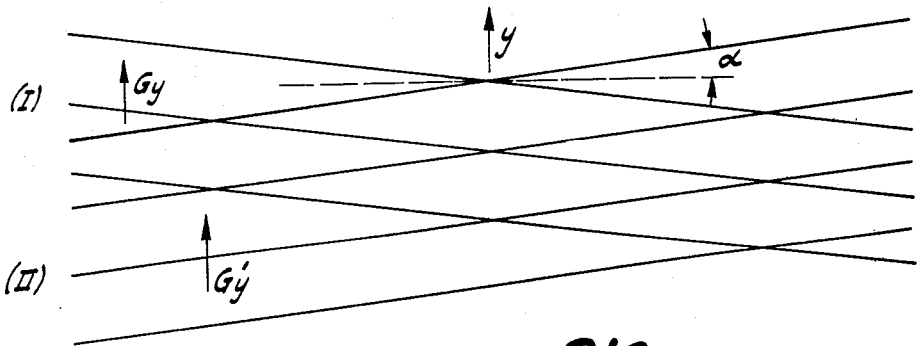
FIG._21C
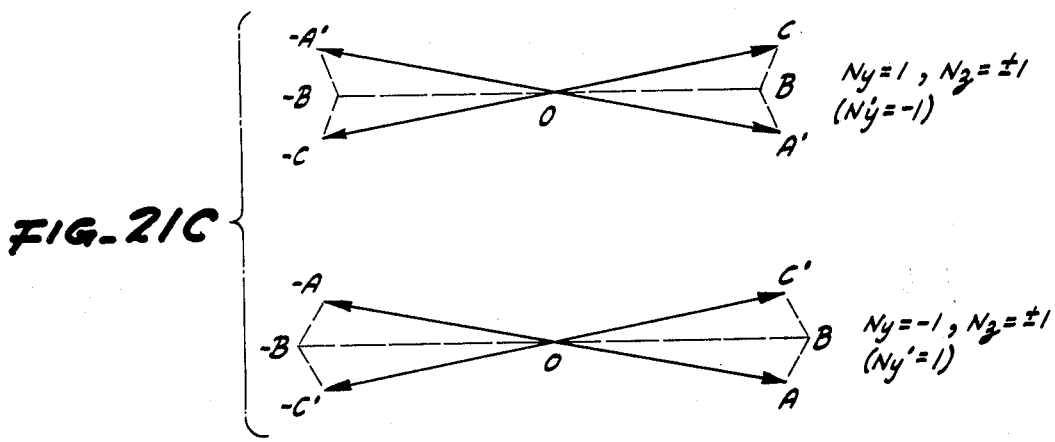
FIG._21C

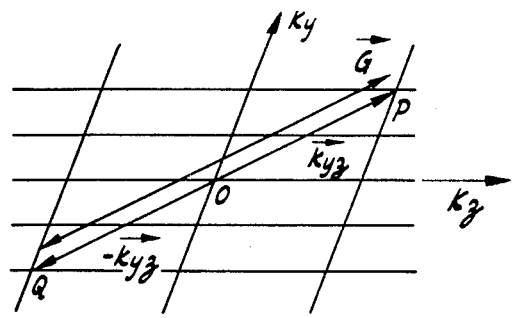
FIG._22A
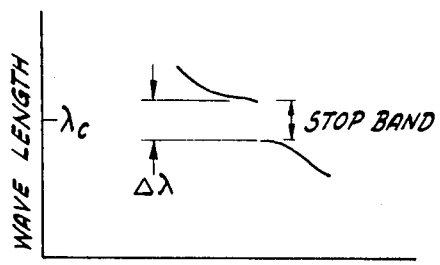
FIG._22B
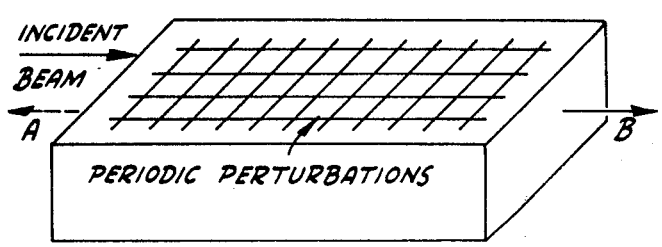
FIG._23A
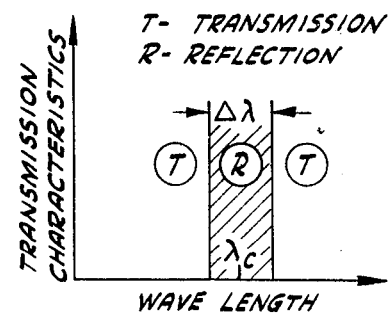
FIG._23B
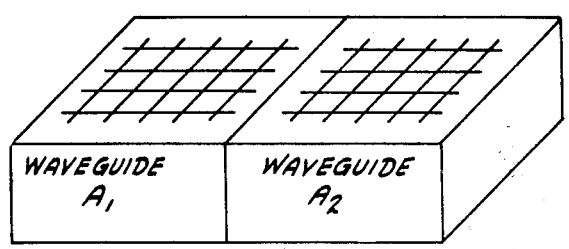
FIG._24A
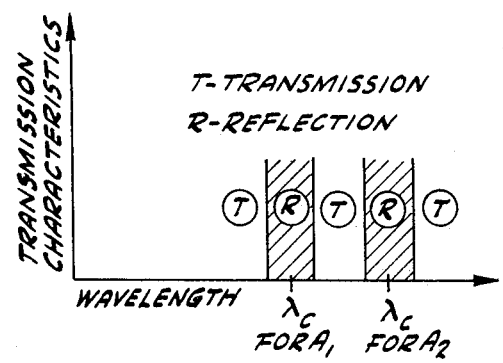
FIG._24B

TWO DIMENSIONAL DISTRIBUTED FEEDBACK DEVICES AND LASERS

The invention herein described was made in the course of research sponsored in part by the United States Army Research Office.

This is a division of application Ser. No. 355,454 filed Apr. 30, 1973, now U.S. Pat. No. 3,884,549.

BACKGROUND OF THE INVENTION

This invention relates to thin film optical devices and lasers and more particularly to an improved form of such devices and lasers in which controllable transverse modes are obtained using a two-dimensional distributed feedback periodic structure.

Reference is made to my article entitled "Proposal of Periodic Layered Waveguide Structures For Distributed Lasers", Journal of Applied Physics, Volume 44, Number 2, February 1973, pages 767–780 and to my previous patent applications entitled (a) Thin Film Lasers, Ser. No. 296,178 filed Oct. 10, 1972 and (b) Thin Film Optical Devices and Lasers, Ser. No. 331,675 filed Feb. 12, 1973, which disclose an invention relating to new classes of optical devices and lasers in which periodic variations are introduced in the structures of a thin film optical waveguide so as to create periodic reflections in the waveguide. These references are incorporated herein by reference. The periodic reflections thus generated give rise to distributed feedback (distributed coupling) between two counter running waves. In other words, the periodic variations in the waveguide structure of a distributed feedback laser serve a function similar to that of mirrors in conventional lasers. The previous invention, as disclosed in the article and referenced patent applications, generally provide for a periodic variation in a single or one dimensional arrangement in which the periodicity of the periodic variations used in the manufacture of such devices must be maintained with considerable accuracy. This limits the usefulness of the previously disclosed optical devices and lasers to materials having a relatively broad gain profile or otherwise requires the imposition of strict manufacturing tolerances with attendant high costs. There is a need, therefore, for a new and improved thin film devices and lasers. In addition, the previous invention provided an output beam in the form of a sheet of light which projects as a line on an intersecting plane. In many applications it is desirable to have a pencil beam of light which would project as a spot on an intersecting surface.

SUMMARY OF THE INVENTION AND OBJECTS

In general it is an object of the present invention to provide a novel thin film optical devices and lasers which will overcome the above limitations and disadvantages.

A further object of the present invention is to extend the usefulness of distributed feedback devices and lasers.

A further object of the invention is to provide a thin film optical devices and lasers of the above character which are tunable by the application of acoustic or electric fields.

A further object of the invention is to provide a thin film optical devices of the above character which are particularly useful as passive devices such as optical filters, modulators, and deflectors.

A further object of the invention is to provide a thin film optical devices and lasers of the above character in which the output is formed as a linear or pencil laser beam which will project as a spot on an intersecting surface.

In general, the foregoing objects and features of the invention are achieved by employing a thin film optical waveguide structure defining a guided wavelength for propagating waves of light at a predetermined frequency in which the waveguide has a predetermined optical index of refraction and is made of a material transparent to light of a predetermined frequency. A boundary layer adjacent to said waveguide is in such proximity that the propagating wave for light at the predetermined frequency extends both within said waveguide and into the boundary layer. The boundary layer has one or more indices of refraction at least a portion of which is less than the index of refraction of said waveguide. First means associated with one of said boundary layers and waveguide or the interface between said boundary layer and said waveguide forms a periodic variation $a_y$ of an optical parameter in a first direction, said periodic variation $a_y$ being arranged for causing a spatial variation of said optical parameter between two values which repeat in a regular pattern of predetermined periodicity. Second means associated with one of said boundary layers and waveguide or the interface of the boundary layer and said waveguide forms a periodic variation of an optical parameter thereof in a second direction. The second periodic variation is arranged to cause spatial variation of that optical parameter between two values which repeat in regular pattern of a second predetermined periodicity $a_z$ wherein said periodicities $a_y$ and $a_z$ are solutions to an equation of the general form $(2\pi/\lambda_g)^2 = F(N_y/a_y, N_z/a_z)$ where $\lambda_g$ is the guided wavelength, $N_y$ and $N_z$ are integers and the ratios $N_y/a_y$, $N_z/a_z$ define an intersection in reciprocal lattice space for a given waveguide structure. In this form the device can serve various passive functions such as filtering, modulation, and deflection.

A laser is formed by making one of the waveguide or boundary layers of a laser active material which exhibits gain to electromagnetic waves at the feedback frequency.

A generalized form of the invention is disclosed when the periodic variations are produced by perturbations such as a two dimensional scattering array defining at least first and second periodic variations $a_y$, $a_z$. Such an array can be created by forming perturbations located at the intersections of a pair of crossed gratings.

The structures of the present invention can be made by direct and permanent physical modification of the layers of a bounded thin film optical waveguide or can be induced by acoustic, magnetic, or electric fields applied to optical waveguide or boundary layers thereof when the latter are constructed of suitable materials.

These and other objects and features of the invention will become apparent from the following description and claims when taken in conjunction with the accompanying drawings.

BRIEF DESCRIPTION OF THE FIGURES

FIGS. 21A, 21B, 21C, 21D are schematic drawings illustrating the operation of two dimensional periodic waveguide structures constructed in accordance with the present invention in which the directions of orientation of periodic variations make a non-orthogonal angle to each other.

FIGS. 22A & B are diagrams showing the Bragg condition and the dispersion diagram respectively for a passive periodic waveguide structure in accordance with the present invention.

FIGS. 23 A & B are schematic diagrams showing a passive waveguide and a transmission characteristic for use as a stop-band filter.

FIGS. 24A & B are schematic diagrams showing combined pair of two dimensional distributed feedback structure constructed in accordance with the present invention and coupled together in tandem together with the combined transmission characteristic thereof useful as a pass-band filter.

BRIEF DESCRIPTION OF THE PREFERRED EMBODIMENTS

If $\vec{k_f}$ and $\vec{k_b}$ are the propagation vector for the two counter running waves with $\vec{k_f}$ for the forward wave and $\vec{k_b}$ for the backward wave, then what is needed to make laser action possible is to introduce a spatial perturbation in the waveguide structure characterized by a reciprocal-lattice vector $\vec{G}$ such that $$\vec{k_f} \pm \vec{G} = \vec{k_b} \qquad (1)$$

The physical meaning of $\vec{G}$ becomes clear shortly. Take, as an example, a waveguide structure with thickness variation in the $z$ direction having a period $a_z$. The reciprocal lattice vector for this one-dimensional structure is simply $\vec{G} = \hat{z} 2\pi/a_z$. For distributed-feedback lasers, the $\vec{k_f}$ and $\vec{k_b}$ vectors appear to be confined in a chosen plane (say the $xz$ plane) which is perpendicular to the plane of the waveguide film. Thus, the period $a_z$ should be so chosen that $a_z = \pi/k_z$ where $k_z = k_{zf} = k_{zb}$.

In a layered waveguide structure, the value of $k_z$ is bound by two limits $k_0 n_f > k_z > k_0 n_{s,t}$ where $n_f$ if the index of refraction of the film, $n_{s,t}$ is the index of refraction of the substrate or the top layer (the superstrate) whichever is larger, and $k_0 = 2\pi/\lambda_0$ is the free-space wave number. The selection of a proper value for $a_z$ is restrained by the following considerations. First, the gain of a laser material has a limited bandwidth. That means, $k_0$ can be varied only within a very limited range. Secondly, for effective waveguide structures, the difference between $n_f$ and $n_{s,t}$ is only a few percent. For example, for polyurethane coated on microscope slide, we have $n_f = 1.55$ and $n_s = 1.51$. These two factors combined impose a very strict requirement on the value of $a_z$. Calculation shows that a control of the period $a_z$ within $\pm 2\%$ is required for the GaAs-Ga$_x$Al$_{1-x}$ As laser system and a control of the period $a_z$ within $\pm 0.05\%$ is required for the Nd-doped-glass laser system.

Figure 1:
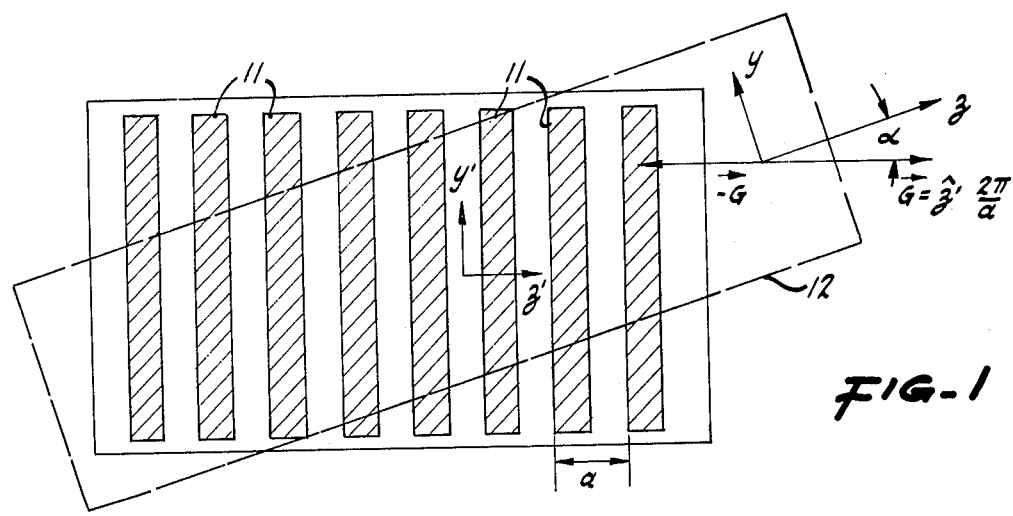
FIG. 1 is a schematic representation of a one dimensional distributed feedback structure constructed in accordance with my previously referenced patent applications.

A precise control of the period required of a one-dimensional distribution-feedback laser limits the usefulness of the distributed-feedback concept to laser materials with relatively broad gain profile. In my previous patent application, one of the schemes I proposed was to have the wave vector $\vec{k}$ oriented away from the $\vec{G}$ direction so that a certain amount of tunability may be possible. In FIG. 1, the shaded grating represents the periodic perturbation in the waveguide structure whose coordinate axes are $y'$ and $z'$, whereas the dahsed lines define the geometry of the pumped region whose coordinate axes are $y$ and $z$. In the chosen coordinate systems, the reciprocal-lattice vector $\vec{G}$ lies in the $z'$ direction and the laser beam propagates along the $z$ direction in the waveguide.

For the laser configuration shown in FIG. 1, the Bragg condition for laser feedback becomes $$k_y = \tfrac{1}{2} N_y G \sin\alpha, \quad k_z = \tfrac{1}{2} N_z G \cos\alpha$$

Thus, the lasing wavelength must satisfy the following relation:

$$\left(\frac{2\pi}{\lambda}n_f\right)^2 = k_x^2 + \left(N_z\frac{\pi}{a}\right)^2 + (N_y^2 - N_z^2)\left(\frac{\pi}{a}\right)^2 \sin^2\alpha \qquad (2)$$

where $N_y$ and $N_z$ are two integers representing the order of Bragg diffraction involved in the feedback action. The question arises: what physical process can be used to generate a transverse distribution in the $y$ direction. It can be shown in semi-conductor lasers that pumping creates a spatial variation in the index of refraction which in turn established mode patterns in the transverse direction, that is, the $y$ direction in FIG. 1. From Eq. (2) it is now seen that for a given period $a$, we can vary $\alpha$ to satisfy the equation. In other words, it is possible to adjust the orientation of the pump beam with respect to that of the periodic structure so that the Bragg condition for feedback (which is essential in achieving laser action) can be satisfied at a certain $\lambda$ within the gain profile of the laser medium.

The above scheme has only limited usefulness for the following reasons. First, the same G appears in $k_y$ and $k_z$. Secondly, since the spatial dependence of refraction index on pumping is not understood, a precise knowledge about $k_y$ and how to control it is not possible.

Figure 2A:
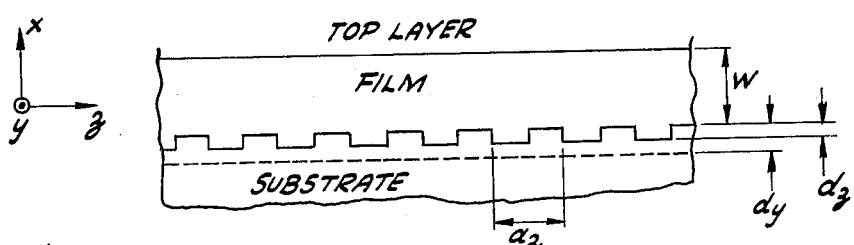
FIGS. 2A, 2B and 2C are schematic front, side and top plane views of a two dimensional distributed feedback structure constructed in accordance with the present invention.
Figure 2B:
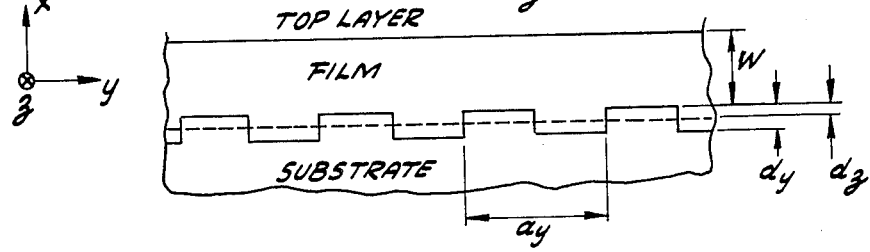
Figure 2C:
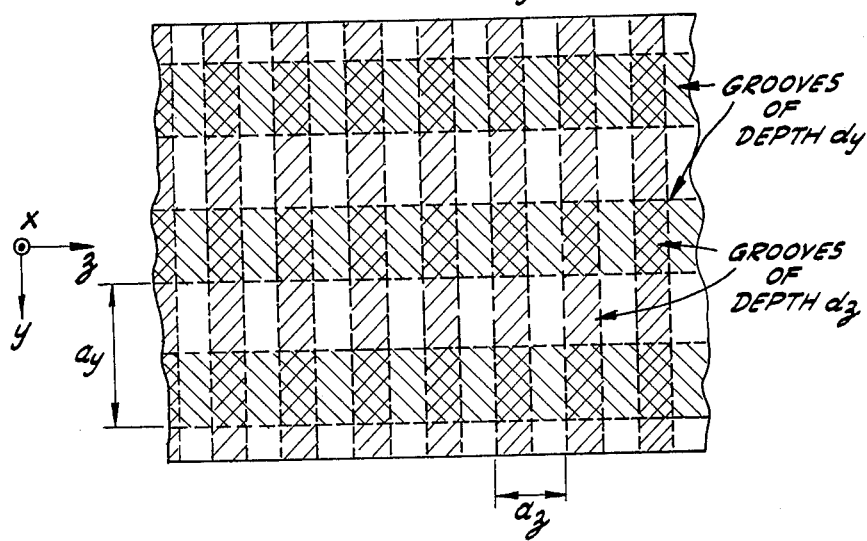

The present invention proposes to make periodic variations in more than one direction in the plane of the film in order to achieve a precise control of transverse modes. There are many ways to implement this idea. One simple way is illustrated in FIG. 2 where a waveguide structure with thickness variations along two orthogonal directions ($y$ and $z$ directions) is shown. In such a waveguide structure, the Bragg condition for feedback becomes $$k_y = \tfrac{1}{2} N_y G_y \quad K_z = \tfrac{1}{2} N_z G_z \qquad (3)$$

where $G_y = 2\pi/a_y$, $G_z = 2\pi/a_z$, $a_y$ and $a_z$ are the period of the thickness variation in the $y$ and $z$ direction, respectively, and $N_Y$ and $N_z$ are two integers representing the order of the Bragg diffraction involved in the feedback.

Figure 3:
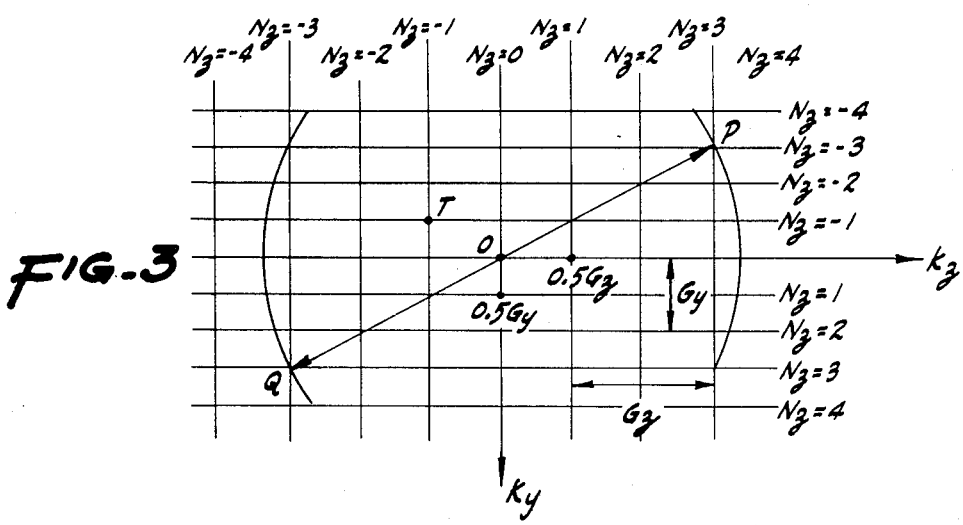
FIG. 3 is a diagram plotting reciprocal lattice space for the structure of FIG. 2.
Figure 4:
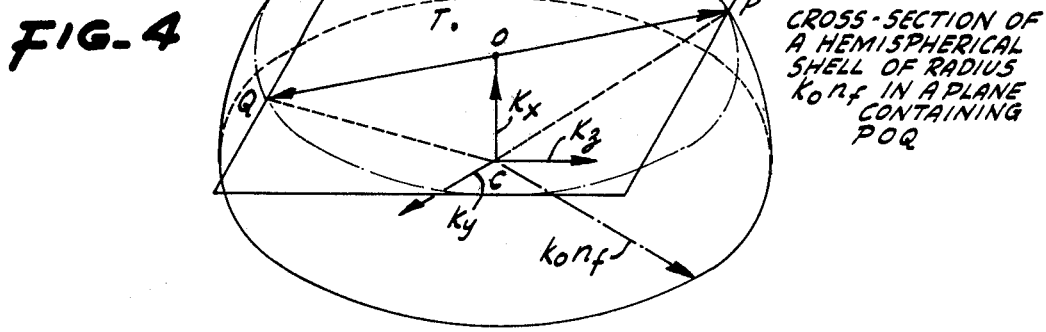
FIG. 4 is a diagram illustrating operating points for the two dimensional distributed feedback laser of FIG. 2 in three dimensional $k$ space.

FIG. 3 is a plot of the $k_y$ and $k_z$ space based on Eq. (3). The vertical lines represent all the possible values for $k_z$ whereas the horizontal lines represent all the possible values for $k_y$. Therefore, any intersection represents a potentially allowable set of values for $k_y$ and $k_z$. The exact determination of the operating condition of a thin film laser is illustrated in FIG. 4. At a given wavelength $\lambda_0$, the magnitude of the $k$ vector is equal to $k = k_0 n_f$ where $k_0 = 2\pi/\lambda_0$ is the free-space wave number. In other words, the operating points must land on a sphere of radius $k_0 n_f$. It is further noted that the allowed values of $k_y$ and $k_z$ are discrete as they are given by Eq. (3). Therefore, the procedure in finding the operating condition can be described as follows. We raise or lower the $k_y k_z$ plane (FIG. 3) along the 0C axis of the $k_0 n_f$ spherical shell (FIG. 4) until two points, such as P and Q, land on the sphere. The vector $\vec{OP} = -\vec{OQ}$ specifis the values of $k_y$ and $k_z$, whereas the vector $\vec{CO}$ specifies the values of $k_x$. The $k_x$ value thus found must satisfy the following equations:

$$2k_x W - \phi_{fs} - \phi_{ft} = 2\pi m \qquad (4a)$$

and, $$k_x^2 + k_y^2 + k_z^2 = \left\{\frac{2\pi}{\lambda} n_f\right\}^2 \qquad (4b)$$

where $\phi_{fs}$ is the phase shift at the film-substrate boundary, $\phi_{ft}$ is the phase shift at the film top layer boundary, $m$ is an integer representing the mode number and $W$ is the film thickness. This defines a discret set of values for $k_x$, $k_y$, $k_z$ as a function of $m$. A thin film laser with periodic perturbations in two directions of the film has all the three components of the $\vec{k}$ vector specified. In contrast, a thin film laser with periodic perturbation only in one direction of the film has only two of the three components of the $\vec{k}$ vector specified.

Figure 5:
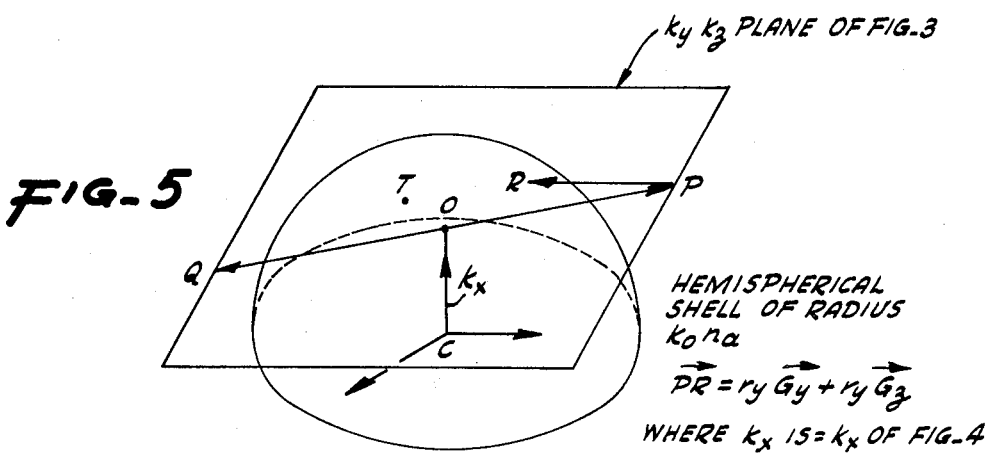
FIG. 5 is a diagram similar to that of FIG. 4 and showing the radiation modes of a laser under a particular set of operating conditions.

Although the structure shown in FIG. 2 is used as an example to illustrate the laser operating principle, it is desirable in practical application to consider structures different from that of FIG. 2. The availability of many $\vec{G}$ vectors for feedback also tends to make the structure lossy. A laser beam, after interacting with the periodic perturbations, will have a $\vec{K}'$ vector given by $$\vec{k'} = \vec{k} \pm a_y \vec{G}_y \pm a_z \vec{G}_z \qquad (5)$$

where $\vec{G}_y = \hat{y} 2\pi/a_y$ and $\vec{G}_z = \hat{z} 2\pi/a_z$ are the two basis vectors in the reciprocal lattice, and $a_y$ and $a_z$ are two integers, and $\hat{y}$ and $\hat{z}$ are the unit vectors in $y$ and $z$ directions respectively. Eq. (1) is a special case of Eq. (5) and is used specifically for feedback. However, there are many possible $\vec{k'}$ vectors. This is clear from FIG. 3. Suppose that the $\vec{k}$ state of a laser beam is represented by the point P initially. The $\vec{k'}$ state of the scattered light (that is the light created after the primary beam interacts with the periodic perturbations) can be an intersection point away from P by an integral number of $G_Y$ and $G_z$. The point T is such a point. If the distance CT is smaller than $k_0 n_a$ where $n_z$ = refractive index of air, then the scattered light will not be totally reflected and can radiate into the surrounding air. Such a scattered mode is called the radiation mode. FIG. 5 shows the $k_y k_z$ plane and the $k_0 n_a$ hemispherical shell. The laser operating condition is represented by points P (the forward wave) and Q (the backward wave). The light scattered from the interaction of the forward wave with the component of periodic perturbation having reciprocal-lattice vector $r_y \vec{G}_y + r_z \vec{G}_z$ is represented by the point R. To be radiative, the point R must be below the $k_0 n_a$ spherical shell. In other words, the length CR must be smaller than $k_0 n_a$. Since there are many intersections in the $k_y k_z$ plane which satisfy the above conditions, there exist many radiative modes for the structure shown in FIG. 2. Especially when the point R gets very close to the $k_0 n_a$ spherical sheel, the radiative mode becomes very strong and thus the waveguide structure becomes very lossy. As will be discussed shortly, many important applications will require a small $G_y$ compared to $G_z$. As the value of $G_y$ decreases, the number of points (like R) being close to the $k_0 n_a$ spherical shell increases and hence the waveguide structure becomes increasingly lossy.

As will be shown later, in order to minimize the loss due to radiation, it is desirable that the two periodic perturbations be physically separated from one another, or in other words, be made not to exist side by side at the same time interface of in the same medium. Separation also makes possible an independent control of the strength of the y-directed and z-directed distributed feedback effects. An example of separate periodic perturbations is illustrated in the FIG. 6 where a periodic thickness variation in the z direction exists at the film top layer interface and a periodic thickness variation in the y direction exists at the film substrate interfere. A schematic representation of the substrate is shown in FIG. 7 where the uniformly spaced lines represent the periodic perturbations at the two interfaces. It is also possible that either or both periodic perturbations be made in the media (the substrate, the film and/or the top layer) instead of at the interface. These alternatives were disclosed in my co-pending application, Ser. No. 331,675 previously referenced.

Figure 8:
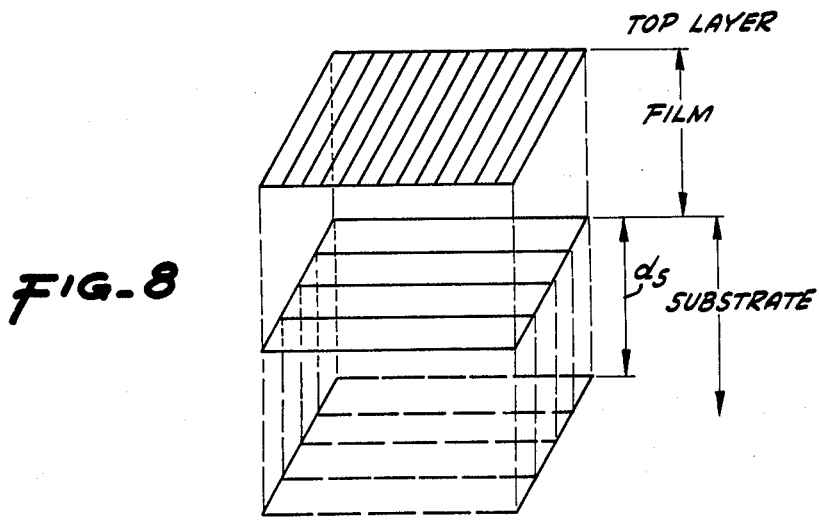
FIGS. 8 and 9 are schematic illustrations of other constructions of two dimensional distributed feedback structures constructed in accordance with the present invention.
Figure 9:
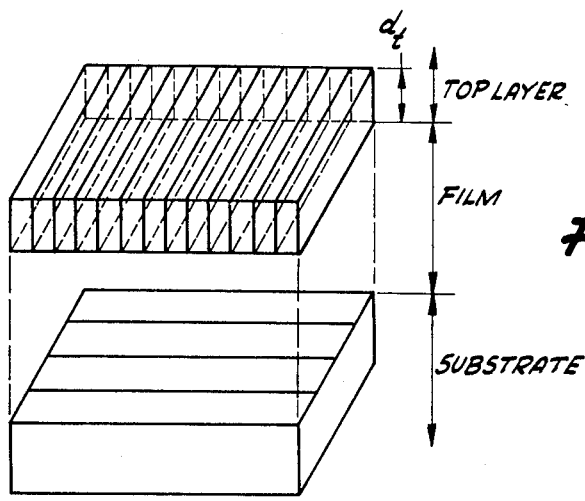

A schematic representation of another useful structure is shown in FIG. 8 where periodic perturbations exist at the film top layer interface and in the substrate. Another useful structure is schematically illustrated in FIG. 9 where periodic perturbations exist at the substrate film interface and in the top layer. In summary, a preferred combination of two periodic perturbations can be any one of the following combinations: (1) one periodic perturbation at the top layer film interface and the other periodic perturbation at the film-substrate interface, (2) one periodic perturbation at either of the two interfaces (top layer film or film substrate) and the other periodic perturbation in one of the three media (film, substrate, or top layer), (3) one periodic perturbation in one of the three media and the other periodic perturbation in either of the two remaining media.

There are many ways to introduce periodic perturbations at the interface and in the medium. A brief discussion of the presently available methods now follows by way of example. If a microscope slide is used for the substrate, then the slide can be first coated with a photoresist film. Subsequently, the photoresist film is exposed to an interference pattern with periodic regions of high and low light intensities, and after the exposure, the photoresist film is developed to produce a relief grating on the microscope slide. Next, grooves are made into the slide either through etching by chemical reagents or through milling by ion beams. Finally, the photoresist film is removed from the slide, and the slide is coated with a film of chosen material for the waveguide. The final product thus will have a periodic thickness variation at the film substrate interface due to the periodic grooves. Similarly, periodic thickness variations can also be introduced at the top surface of the film, using laser beam lithography or electron beam lithography techniques.

Figure 10A:
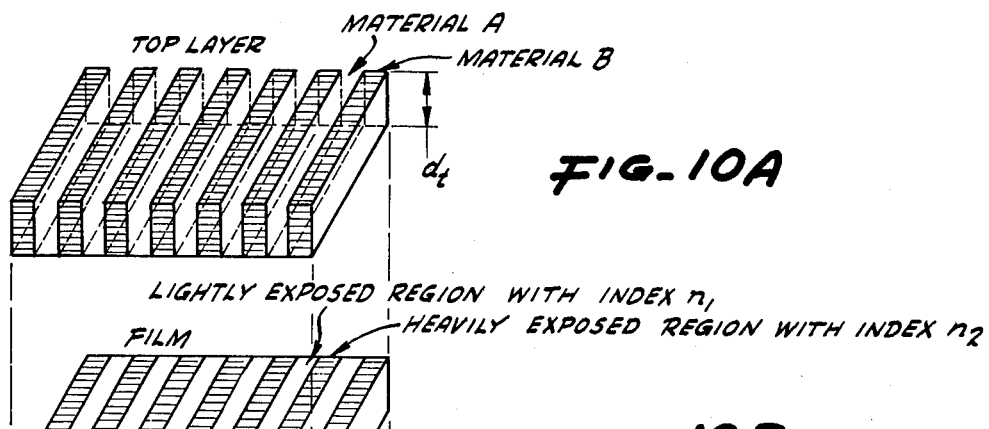
FIGS. 10A, 10B and 10C are exploded views illustrating various ways of introducing periodic perturbations in the boundary layers and in the film.
Figure 10B:
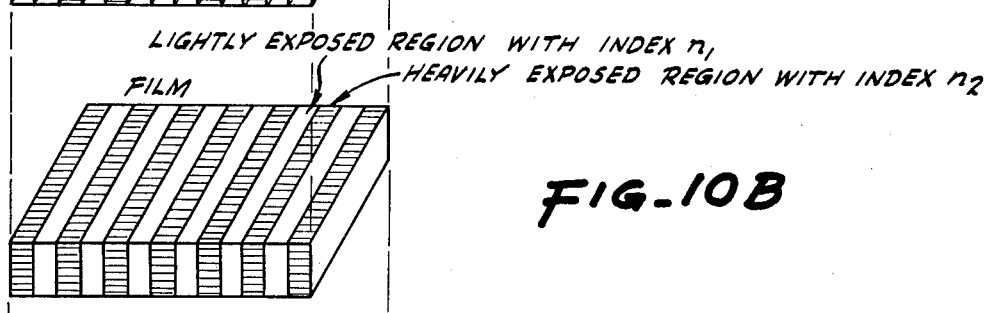
Figure 10C:
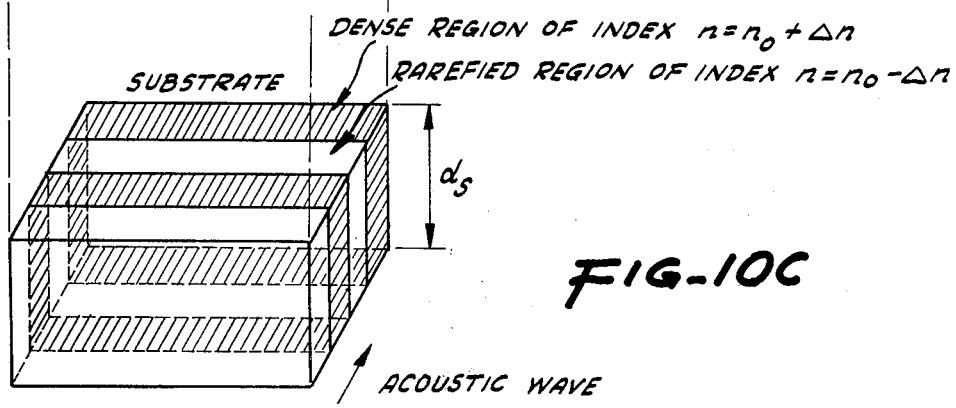

FIG. 10 is a schematic diagram illustrating how periodic perturbations can be incorporated into the top layer, the film, or the substrate. For example, in the GaAs-Ga$_x$Al$_{1-x}$ As laser system, GaAs is used as the film material and Ga$_x$Al$_{1-x}$ As is used as the substrate material. If periodic perturbations are desired in the top layer, a layer of SiO$_2$ or ZnO material is deposited on top of the GaAs film. Again, either chemical etching or ion milling can be used to remove a part of the SiO$_2$ or ZnO material in a pre-designed and periodic manner. The finishing laser structure thus will have a top layer made of laternate and periodic regions of material B (SiO$_2$ or ZnO) and material A (air) as illustrated in the top diagram of FIG. 10.

A periodic perturbation can also be created by an acoustic wave through the photo-elastic effect. A simple physical explanation for the effect may be stated as follows. It is known that an acoustic wave creates alternatively and periodically dense and rarefied regions. Since the index of refraction is a function of both the atomic arrangement and the density in a given material, an acoustic wave will be accompanied by a periodic variation in the index of refraction (as schematically illustrated in the bottom diagram of FIG. 10). It may be worthwhile to point out that light beam is mostly confined in the film of a waveguide structure, and penetrates only to a certain depth into the top layer and the substrate. Therefore, the depth of periodic perturbation ($d_t$ for the top layer and $d_s$ for the substrate as indicated in FIGS. 9 and 10) in the top layer and in the substrate needs only to extend slightly beyond the respective penetration depth in the two regions. That means $d_s$ and $d_t$ will have a value of the order of the wavelength of the laser beam propagating in the film. In certain thin film lasers such as the dye laser, it is also possible to introduce periodic perturbations in the film itself. It is well known that a permanent change in the index of refraction will occur in photoresist materials if exposed to light, and polymethylmetharylate if exposed to energetic electrons. A film with periodic index variations is schematically illustrated in the middle diagram of FIG. 10.

Figure 11:
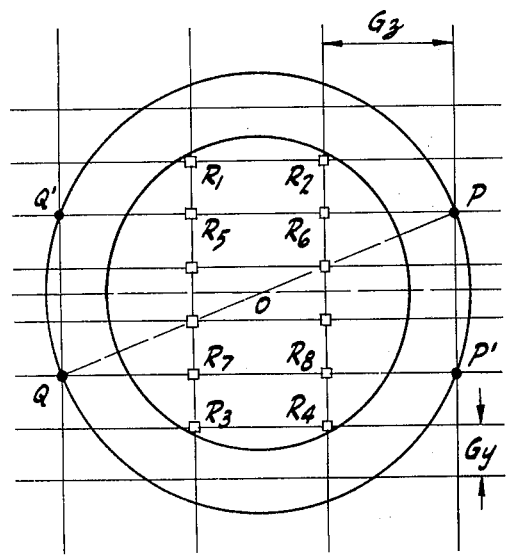
FIGS. 11 and 12 show graphs of portions of reciprocal lattice space for particular sets of conditions of operation of a two dimensional distributed feedback laser constructed in accordance with the present invention.
Figure 12:
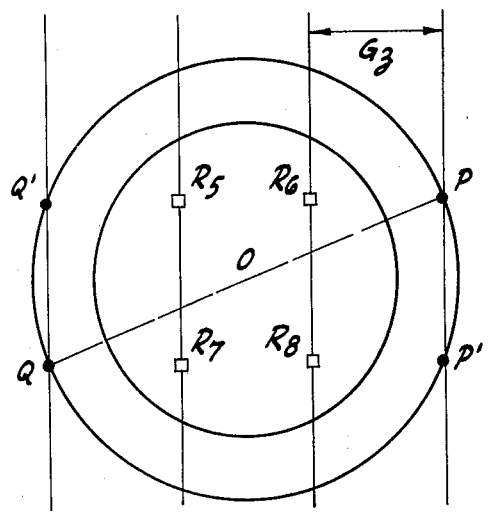
Figure 12:
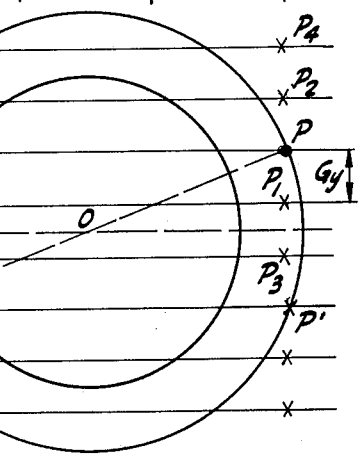

The superiority of thin film lasers having two separate periodic perturbations is best seen by referring to FIGS. 11 and 12. FIG. 11 shows, as an illustrative example, the available values of $k_y$ and $k_z$ for a certain thin film laser. The larger circle represents the intersection of the $k_0 n_f$ spherical shell with the $k_y k_z$ plane, whereas the smaller circle represents the intersection of the $k_0 n_a$ spherical shell with the $k_y k_z$ plane. Points P and Q where the bigger circle runs through the intersection of the $k_y$ and $k_z$ lines represent the operating condition of the laser. For the example shown in FIG. 11, $k_z = 1.5\ G_z$ for the forward wave and $k_z = -1.5\ G_z$ for the backward wave. If the two periodic perturbations are orthogonal, then points P' and Q' which are symmetrically located with respect to P and Q also meet the operating condition requirement. Therefore, from FIG. 11, $k_y = \pm 1.5\ G_y$.

Two important questions regarding a thin film laser are its radiation loss and coupled out signal. Here distinction must be made between a thin film laser with the two periodic perturbations being in the same location and a thin film laser with the two periodic perturbations being in separate locations. As a specific example, it is assumed that the thin film laser represented in FIG. 11 has a periodic structure as that shown in FIG. 2 with thickness variations in the y and z directions existing simultaneously at the film substrate boundary. Because of the availability of many reciprocal lattice vectors $\vec{G} = N_y \vec{G}_y + N_z \vec{G}_z$ at the film substrate boundary, there exist many radiation modes such as points R$_1$, R$_2$ etc., lying within the smaller circle in FIG. 11. For example, a laser beam represented by the point P can be scattered to the point R$_2$ and thus be coupled out from the thin film waveguide. The existence of many radiation modes is undesirable for the following reasons. As mentioned earlier, some of the modes may lie very close to the smaller circle and thus are strongly radiating. The strongly radiating modes effectively increase the loss of the laser. It should also be pointed out that all the radiation modes represented by points R$_1$, R$_2$, etc. originate from the same laser beam and yet have different directions of propagation. In other words, a laser beam is simply scattered into many directions. This is at variance with the original intention of the present invention that each light beam coupled out from a thin film laser constitutes a distinct channel operating at a different wavelength.

In contrast to FIG. 11 a different situation is shown in FIG. 12 where the two periodic perturbations are separate from one another. As a specific example, it is assumed that the thin film laser has a periodic structure as that shown in FIG. 6 with the thickness variation in the y direction existing at the film top layer boundary and the thickness variation in the z direction existing at the film substrate boundary. Insofar as the laser operating condition is concerned, the situation shown in FIG. 12 is identical to that shown in FIG. 11 if $G_y$ and $G_z$ in the two cases are the same. A laser beam propagating in the film experiences the combined effects of $G_y$ and $G_z$. Therefore, the laser operation condition is still represented by the points P and Q and the points P' and Q'. However, insofar as the radiation loss and coupled out signal are concerned, the situation for FIG. 12 is quite different from that for FIG. 11. When a laser beam hits the film top layer boundary, the only reciprocal-lattice vectors available for the scattering process are those in the y direction, that is $\vec{g} = N_y \vec{G}_y$. In other words, the points P and P' can only be scattered to $P_1$, $P_2$, etc., whereas the points Q and Q' can only be scattered to $Q_1$, $Q_2$, etc. Since all the points $P_1$, $P_2$, etc., and $Q_1$, $Q_2$, etc., are outside the smaller circle, none of the scattered light can radiate out from the thin film waveguide. When a laser beam hits the film substrate boundary, the only reciprocal lattice vectors available for the scattering process are those in the z direction, that is, $\vec{G} = N_z \vec{G}_z$. The points $R_5$, $R_6$, $R_7$ and $R_8$ in FIG. 12 represent all possible radiation modes of the laser, which are the same as those in a corresponding one-dimensional distributed feedback laser. Therefore, the radiation loss in a two dimensional distributed feedback laser can be reduced to a minimum amount equal to that in a corresponding one-dimensional distributed feedback laser if two separate periodic perturbations are used in the two dimensional laser.

The characteristics of a two-dimensional DFB laser can be summarized as follows. Owing to the availability of many reciprocal lattice vectors $\vec{G}$, the output will show multiple modes oscillating simultaneously. However, each laser mode is expected to show a very narrow spectral width and a sharply defined direction owing to the additional selection for the value of $k_y$. Such a two-dimensional DFB laser offers a definite possibility as a source for multichannel operation in an integrated optical system. The laser medium for multichannel operations should have a relatively broad spontaneous emission-band width. Semiconductors and organic dyes are natural candidates for such purposes.

We should also point out that a DFB scheme based on a two dimensional periodic waveguide structure should be extremely useful in achieving laser action in materials with relatively narrow spontaneous emission band. The main difficulty with these materials is the precise control required of the period so that the Bragg wavelength $\lambda_B$ will fall within the gain profile of the laser medium. In a two-dimensional DFB laser, we can make $a_y$ much bigger than $a_z$ and thus use $G_y$ as a fine control for G. For thickness variations made through chemical etching, the etched grating can be made almost rectangular in shape; hence the periodic change in the longitudinal wave number is better approximated by a rectangular spatial dependence than a sinusoidal spatial dependence. It is well known that a rectangular wave has rich harmonic contents which drop off as $1/q$ where q is the order of the spatial harmonic. For a 0.9 $\mu$m gelatin film deposited on a quartz substrate, a $\pm$ 0.05 $\mu$m thickness variation results in a feedback coefficient of the order of 200 cm$^{-1}$ for the first order Bragg scattering. For the 9th spatial harmonic, the feedback coefficient is expected to be around 22 cm$^{-1}$, a value generally sufficient to cause laser action. We can further increase the number of possible $\vec{G}$ vectors by making the periodic lattice in the shape of a parallelogram instead of a rectangle. Using a two-dimensional oblique grating structure of unequal periods and working with high spatial harmonics, one may be able to extend the usefulness of the distributed feedback concept to laser materials with narrow emission band, such as Nd-doped galss or Nd-activated lathanum oxysulfide.

In the following discussion, experimental results on two-dimensional thin-film DFB dye lasers is reported. A microscope slide was coated with Kodak KOR photoresist. The coated photoresist film was then exposed to an interference pattern produced by an argon laser at 0.488 $\mu$m. After the period of the interference pattern was readjusted and the orientation of the microscope slide was turned by 90° around an axis normal to the slide, the photoresist film was again exposed. Development of the photoresist film left a two-diemensional relief grating on the microscope slide. Subsequent chemical etching produced two-dimensional grooves of about 0.1 $\mu$m deep into the SiO$_2$ substrate. The periods $a_y$ and $a_z$ of the etched grating structure were determined by diffraction experiments. For normal incidence one has $a_y = \lambda[1 + (2d/y)^2]$ and a similar expression for a $a_z$ where y is the separation measured between the two maxima of diffracted light closest to the origin and at a distance d from the grating. Of the several gratings made, the one used in the experiment reported here has the following set of values: $a_y = 4.34$ $\mu$m and $a_z = 0.635$ $\mu$m.

The etched microscope-slide substrate, after the photoresist was removed, was coated with polyurethane doped with rhodamine 6G to a film thickness W around 0.8 $\mu$m For a mode to be confined in a waveguide with a substrate index $n_s$ and a film index $n_f$, we must have $n_f k_0 > k_z > n_s k_0$ which sets an upper limit for $k_x$. With a value for W chosen to be below 1$\mu$m, the waveguide can support only the fundamental ($m = 0$) mode in the x direction. A N$_2$ laser beam focused by a cylindrical lens was used to pump a narrow strip of the film about 2 cm long. The amount of pumping power density was varied by changing the focal position of the lens. Above a certain threshold density of pumping power, laser action took place with a strong emission around 0.642 $\mu$m. This strong emission was accompanied by the appearance of mode structure in the laser beam.

For the two dimensional DFB laser reported here, third order Bragg scattering was utilized to produce the necessary feedback between the forward and backward running waves. If we assume that the light we observed in the experiment was diffracted out of the film through first-order Bragg scattering by interaction with the grating in the z direction, then the diffracted light would have a $\vec{k}$ vector with its components in the yz direction given by $\vec{k}_{yz}' = \hat{y}0.5N_y G_y + \hat{z}(1.5 - 1) G_z$. Thus the angle $\theta$ between the z-directed light spot ($N_y = 0$) and either one of the two adjacent spots ($N_y = \pm 1$) is expected to be tan$^{-1}(G_y/G_z)$ or tan$^{-1}(0.147)$. The experimentally observed value for $\theta$ is tan$^{-1}$ (0.146).

The value of $k_x$ can be calculated from Eq. (4a). Using $k_{yz} \approx k$ and $W = 0.85$ $\mu$m, we find $k_x = 0.18$ $k_{yz}$.

Thus, the theoretical laser-wavelength $\lambda$ is 0.645 $\mu$m for the fundamental transverse mode with $N_y = 0$. The separation $\Delta\lambda$ in wavelength for transverse modes with nonzero $N_y$ from the $N_y = 0$ mode is approximately equal to $\Delta\lambda/\lambda = -0.5(N_y\lambda/2n_fa_y)^2$. The calculated values are: $\Delta\lambda = -7.5$A for $N_y = \pm 1$, $\Delta\lambda = -30$ A for $N_y = \pm 2$, and $\Delta\lambda = -67$ A for $N_y = \pm 3$. Experimentally, the observed laser emission spectrum consists of several sharp lines centered around 0.642 $\mu$m and with a maximum separation about 100 A. These observations are in general agreement with the theory.

In the experiment reported here, the two sets of periodic perturbations are at the same location, namely at the film substrate boundary. That means, reciprocal lattice vectors available for coupling laser beam out of the film are, in general, two dimensional vectors containing both y and z components. As a result, a given transverse mode can be scattered out from the film to appear in different orientations through its interaction with reciprocal lattice vectors with different N, and the coupled out laser beam actually consists of several transverse modes with different $N_y$. In principle the situation can be remedied by using two separate sets of periodic perturbations in different locations, for example, one at the film substrate boundary and the other at the film top layer boundary. Insofar as the distributed feedback effect is concerned, the available $\vec{G}$'s are kept two-dimensional. However, the gratings at the two boundaries are now made one dimensional.

One interesting extension of the foregoing experiment is to have two separate periodic structures for two dimensional DFB lasers, one being in the superstrate oriented in the z direction and the other being in the substrate oriented in the y direction. For the y-directed spatial variation, we can use acoustic waves with frequency in the $10^8$ Hz range to create an index variation with a 20$\mu$m spacing. By varying the acoustic frequency (used as a fine tuning) and by changing the axis of the pumping beam (used as a coarse control), it is expected that we can have DFB thin film dye layers tunable almost continuously over a wide wavelength range.

Figure 13:
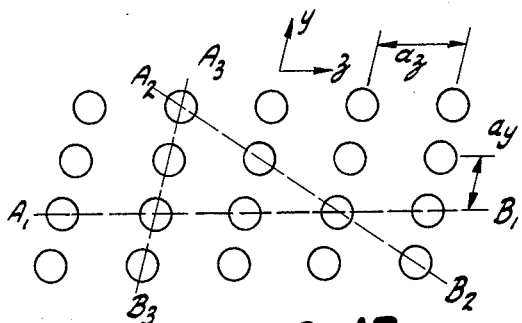
FIG. 13 is a top plane view schematically illustrating a dot scattering array two dimensional distributed feedback structure constructed in accordance with the present invention.
Figure 14:
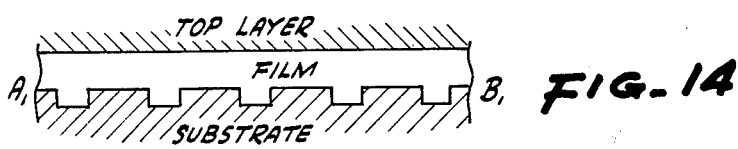
FIG. 14 is a schematic cross-sectional view of an etched or hollow dot structure taken generally along the reference lines $A_1$–$B_1$ of FIG. 13.
Figure 15:
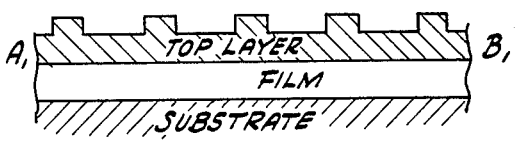
FIG. 15 is a schematic cross-sectional view of a protrusion array taken generally along the reference lines $A_1$–$B_1$ of FIG. 13.

In the waveguide structures presented in the foregoing discussion, two dimensional feedback effect is produced by two sets of line gratings oriented in different directions in a plane or in spaced planes parallel to the plane of the waveguiding film. Since reflection from a line grating is directed toward a specific direction, the two dimensional effect produced thereby is actually a superposition of two linear (one dimensional) effects. In the following discussion an alternate and different way of achieving two dimensional feedback effect is presented. For illustrative purposes, a waveguide with two dimensional array of scattering perturbations is shown in FIG. 13. In contrast to the structure shown in FIG. 2 where the perturbations are caused by parallel and straight grooves, the structure shown in FIG. 13 has its structural change caused by isolated perturbations such as hollows (FIG. 14) or protrusions (FIG. 15) which are arranged in a periodic manner in a two dimensional array as in FIG. 13. In this structure, each hollow (or each protrusion) acts as a scattering center. If the cross-section of each hollow (or protrusion) is nearly circular in shape, then each scattering process is almost isotropic, having nearly equal strength in all directions in the yz plane. Therefore, diffraction of a light beam by such dot array structures is very much smaller to diffraction of an X-ray by an atomic structure insofar as the diffraction property in the two dimensional yz space is concerned. The light reflected from the plane $A_2B_2$ in FIG. 13 is expected to be nearly as strong as the light reflected from the plane $A_1B_1$. In contrast, for the grid-like structure of FIG. 2, the light reflected from planes parallel to the grating is expected to be stronger than the light reflected from other planes.

Figure 6A:
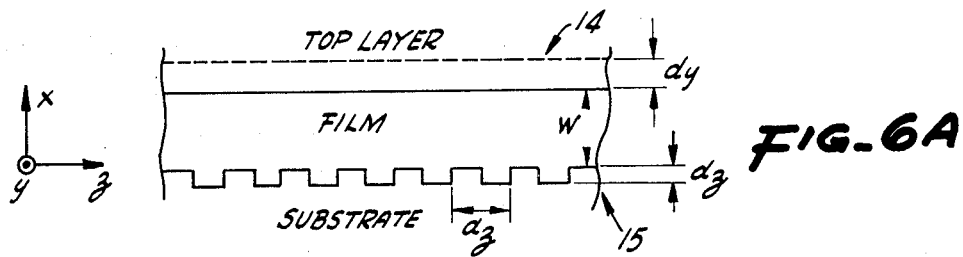
FIGS. 6A and 6B and 7 are schematic views of a two dimensional distributed feedback structure constructed in accordance with the present invention in which the planes creating the feedback are separated.
Figure 6B:
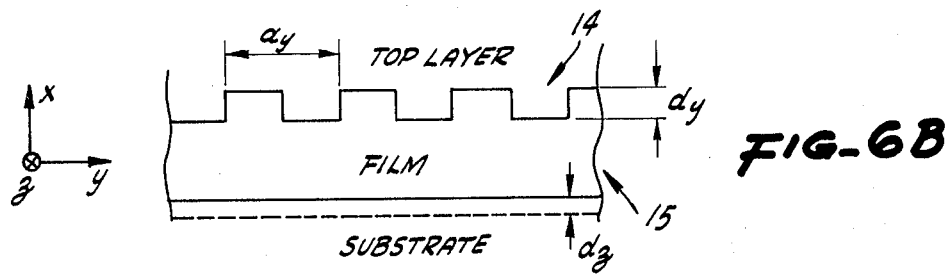
Figure 7:
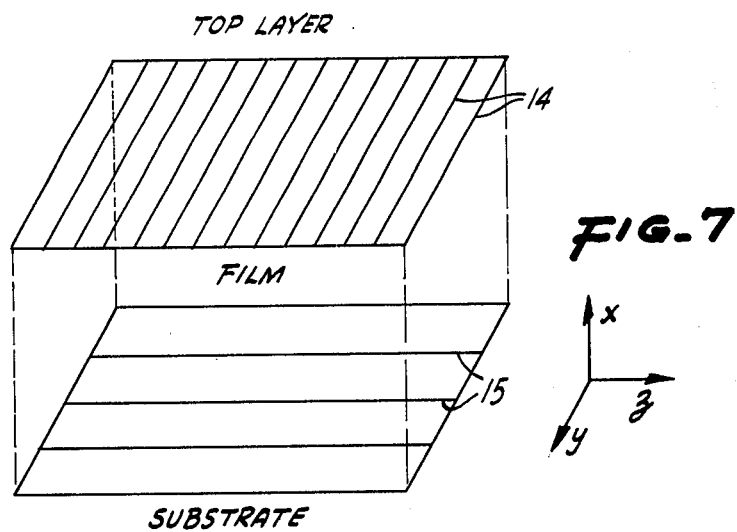

The periodic structures of both FIG. 13 and FIG. 6 possess two dimensional properties which can be used in active as well as passive thin film optical devices. The structure of FIG. 13 is easier to fabricate than that of FIG. 6. The former also provides distributed feedback of nearly equal strength from different reflecting planes. A two dimensional laser using a dot array structure is expected, therefore, to give laser outputs of nearly equal strength as the longitudinal direction of the pumping beam is rotated in a tunable laser to select different sets of $\vec{G}$ in Eq. (1). The tunability of such a laser covers a wide wavelength range. On the other hand, the structure of FIG. 6 has a great deal of flexibility. For example, the strengths of the y-directed and z-directed feedback effects can be independently controlled by making $d_y$ and $d_z$ different. A laser operated with a fixed $N_z$ but different $N_y$'s can be made to give transverse modes with nonzero $N_y$'s of nearly equal strength as the fundamental mode with $N_y = 0$ by using a large $d_y$ so that the y-directed feedback effect is strong. A laser using the structure of FIG. 6 can also be tuned electrically if one set of periodic perturbations is caused, for example, by an acoustic wave. However, such electric tunability which is possible only with line gratings is expected to cover a relatively narrow wavelength range. From the above discussion, it seems that the structures of FIG. 13 and FIG. 6 will complement each other in their usefulness in thin film optical devices.

The foregoing discussion concerning two dimensional dot arrays and two dimensional gratings serves to illustrate that the invention disclosed herein can be implemented by many structures. In general, many structures having a two dimensional periodicity are known from work on reticles (graticules) wherein such doubly periodic structures are used for distance measurements. Many such systems of dots, line, or partial line nets can form the geometrical basis of the perturbations required in the present invention.

In the foregoing discussion, it is shown that a thin film laser with two separate periodic perturbations can be as efficient as a thin film laser with a single periodic perturbation. It is the purpose of the following discussion to show the many important applications of thin film lasers having two separate periodic perturbations. For ease of discussion, the applications of the present invention are divided into two categories. The first category applies to materials where it is necessary to use two periodic perturbations in order that the concept of distributed feedback may succeed. The second category applies to materials where using two periodic perturbations will provide new and useful applications which are not possible with a single periodic perturbation.

So far, the concept of distributed feedback has been successfully applied only to dye lasers. Thin film dye lasers have been made operative by using periodic thickness variations to provide the necessary feedback. The reason for easy success with dyes is that dyes that a very broad and strong emission band, and as a result, the condition for laser oscillation can easily be satisfied. There are many important laser materials which have a narrow emission band. For example, rare-earth doped glass has a spontaneous emission bandwidth of the order of 30 A, GaAs-Ga$_x$Al$_{1-x}$As semiconductor heterojunction has a spontaneous emission bandwidth of the order of 100 to 200 A. For laser materials with spontaneous emission bandwidth about or below 100 A, an accurate control of the physical dimensions of a thin film laser, mainly the thickness of the film and the period of the thickness variation, becomes essential. For a thin film laser using first order Bragg scattering for distributed feedback, a spontaneous emission bandwidth of 100 A simply means that the period of the thickness variation has to be controlled within a tolerance of 30 A in a film with index of refraction $n_f = 1.67$ and within a tolerance of 15 A in a film with index of refraction $n_f = 3.34$. Such a tight tolerance makes it difficult to make the appropriate periodic structure for the one dimensional periodic perturbation thin film laser. Using two periodic perturbations greatly relaxes the tolerances in the values of $a_z$ and $a_y$.

For a thin film laser with two orthogonal periodic perturbations, the wavelength condition is $$( \frac{2\pi}{\lambda} n_f)^2 = (N_y \frac{\pi}{a_y})^2 + (N_z \frac{\pi}{a_z})^2 + k_x^2 = ( \frac{2\pi}{\lambda_g} )^2 + k_x^2 \qquad (6)$$

where $\lambda g$ is the guided wavelength in the film. Let $a_y = a_{y0} + \Delta a_y$ and $a_z = a_{z0} + \Delta a_z$ where $\Delta a_y$ and $\Delta a_z$ are the respective amount of uncertainty from the exact values $a_{y0}$ and $a_{z0}$ in making the periodic structure. Expansion of Eq. (6) yields $$( \frac{2\pi}{\lambda_0} n_f)^2 (1- \frac{2\Delta\lambda}{\lambda_0} ) = k_x^2 + (N_y \frac{\pi}{a_{y0}} )^2 (1- \frac{2\Delta a_y}{a_{y0}} ) + (N_z \frac{\pi}{a_{z0}} )^2 (1- \frac{2\Delta a_z}{a_{z0}} ) \qquad (7)$$

where $\Delta\lambda$ is the spontaneous emission bandwidth. If $a_{y0}$ is made much larger than $a_{z0}$, say $a_{y0} = 10a_{z0}$, then a much larger $\Delta a_y/a_{y0}$ than $\Delta a_z/a_{z0}$, by a factor of about 100, can be tolerated such that Eq. (7) is satisfied within the spontaneous emission bandwidth $\Delta\lambda$. Eq.(6) also shows that if $a_y >> a_z$, the term $(\pi N_y/a_y)^2$ can be used as a fine tuning to satisfy the wavelength condition. By using different values of $N_y$ in Eq. (6), it is possible to compensate for the error caused by an inaccurate value of $a_z$. In other words, even if $a_z$ is away from the desired value by a value much larger than 30 A, there will be at least one waveguide mode (with a definite set of $N_y$ and $N_z$) which may satisfy Eq. (7). The term $(N_y\pi/a_y)^2$ makes up the difference. This added flexibility by using two periodic perturbations greatly relaxes the tolerances on the values of $a_y$ and $a_z$, and this relaxation is extremely useful for laser materials with a narrow spontaneous emission band.

Figure 16:
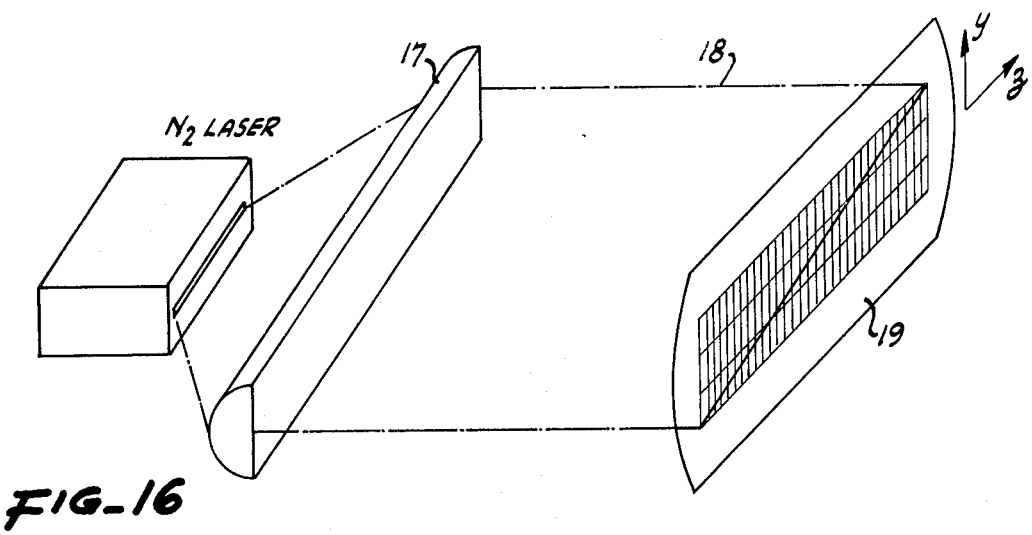
FIG. 16 is a schematic illustration of a tunable laser constructed in accordance with the present invention.

Among the many new applications which are made possible by using two separate periodic perturbations is the tunability of a thin film laser. From Eq. (6) it is obvious that the laser wavelength $\lambda$ can be changed by using different values of $N_y$ and $N_z$. A practical arrangement is shown in FIG. 16 in which a cylindrical lens 17 is used to focus the pumping light into a long and narrow beam 18 impinging on a double periodic structure 19 as disclosed herein. In other words, the pumped region has a rectangular geometry similar to the one shown in FIG. 1, as defined by the dashed lines. Because of the geometry of the pumping beam, only those modes are favored which have the projection of the $\vec{k}$ vector in the yz plane nearly coinciding with the long direction of the rectangle. Therefore, by rotating the axis of the cylindrical lens, the long direction of the pumping beam is changed and thereby a different set of values for $N_y$ and $N_z$ is favored in Eq. (6) for laser action.

Figure 17:
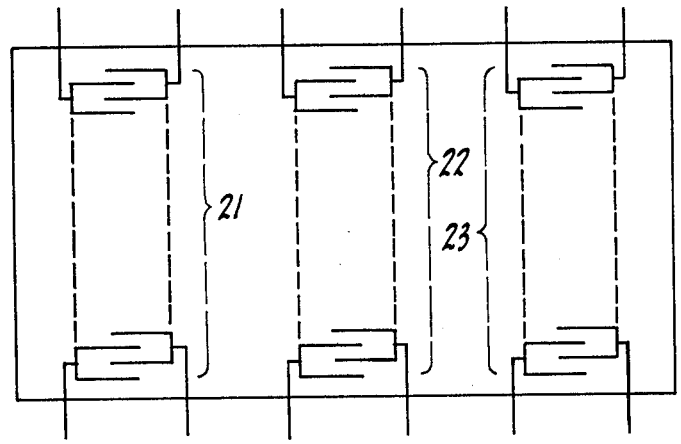
FIG. 17 is a schematic view of a tunable optical device constructed in accordance with the present invention and using acoustic wave tuning.

The lasing wavelength can also be tuned by varying the period $a_y$ or $a_z$ whichever is larger while holding the smaller period fixed. As a specific example, it is assumed that a fixed periodic perturbation exists in the z direction at the film top layer boundary and a variable periodic perturbation in the y direction exists in the substrate. The variable periodic perturbation is caused by an acoustic wave propagating in the substrate along the y direction. The period $a_y$ thus can be varied by changing the frequency of the acoustic wave. The acoustic velocity in most materials is of the order of 2 $\times$ 10$^5$cm/sec. For $a_y = 20$ microns, the frequency of the acoustic wave is about 10$^8$ cycles/sec. Practical methods are available for generating acoustic waves in the microwave region with frequency in the neighborhood of $2 \times 10^9$ cycles/sec or below. The techniques of acoustic beam steering are well established and can be useful in the present application. In FIG. 17, an array of acoustic transducers 21, 22, 23 is shown. By changing the relation phase of the acoustic wave generated by each transducer, the direction of the acoustic wavefront can be varied. If the phase of the acoustic wave is advanced progressively from transducer 23 to transducer 21, then the acoustic wavefront is steered toward the left as illustrated in FIG. 17. On the other hand, if the phase of the acoustic wave is retarded progressively from transducer 23 to transducer 21, then the acoustic wavefront is steered toward the right. Since the direction of the acoustic wavefront represents the direction of $\vec{G}_y$ in the present context, the angle between $\vec{G}_y$ and $\vec{G}_z$ can be varied by changing the relative phase of the acoustic waves generated in each transducer. It should be pointed out that periodic variations in the property of a waveguide (the substrate, the film, or the top layer) can also be produced by means other than acoustic waves. In ferro-or ferri-magnetic materials, the size of magnetization domains can be controlled by a biasing magnetic field. In ferroelectric materials, the size of electric-polarization domains can be varied by an applied biasing electric field. In nematic liquid crystals, grating-like domains (known as Williams domains) of alternate values of index of refraction are formed if an electric field applied across the liquid crystal exceeds a certain threshold value. The period of the grating-like domains can be varied over a wide range (from 5 microns to 60 microns) either by changing the frequency of the applied electric field if the liquid crystal is operated in the Williams-domain mode or by changing the value of the applied electric field if the liquid crystal is operated in the variable-grating mode. In cholesteric liquid crystals, a dilation of the pitch of the helix molecular structure results upon the application of an electric field. The pitch can cover a range from 0.2 micron to 20 microns, depending on the choice of cholesteric liquid crystals. Once a cholesteric liquid crystal is chosen, the pitch and hence the value of $a_y$ in Eq. (6) can be varied either by changing the applied electric field or by changing the ambient temperature.

Another important application which is made possible by using two separate periodic perturbations is for multi-channel operation of a thin film laser. If $a_y$ is made much larger than $a_z$ in Eq. (6), then waveguide modes with the same $N_z$ but different $N_y$ will have only slightly different wavelength. For a thin film DFB (distributed feedback) laser having a single periodic perturbation, the coupled out signal appears at a projected line (the so-called mode-line or m-line) because only the values of $k_x$ and $k_z$ are specified. For a thin film DFB laser having two periodic perturbations, the coupled out signals are lines projected as dots because all the components $k_x$, $k_y$ and $k_z$ are specified. Each dot has a different set of $k_x$, $k_y$, and $k_z$. Therefore, when the lasing modes are coupled out from the periodic thin film waveguide (either by a grating coupler or a prism coupler), each mode will have a distinct direction of propagation and a distinct wavelength. These features are not only useful but also necessary for multi-channel operation of a thin-film DFB laser.

The simultaneous lasing of several transverse modes of slightly different wavelengths makes possible the operation of a scanning laser beam. It has been demonstrated with conventional lasers that if the many transverse modes of a laser are made to oscillate with a definite phase relationship, then the combined effect of all the transverse modes produces a laser beam which travels back and forth in the transverse direction as a function of time. The technique of making different modes to oscillate with definite phase relationship is called mode-locking. It should be pointed out that there are also longitudinal modes (see my previously referenced applications, Ser. No. 296,178 and 331,675) in a thin film laser and the longitudinal modes can also be phase locked. If transverse and longitudinal modes are simultaneously locked in phase, then the light energy can be confined to a small region in space and travels a zigzag path as it reflects back and forth in the laser cavity.

Figure 18A:
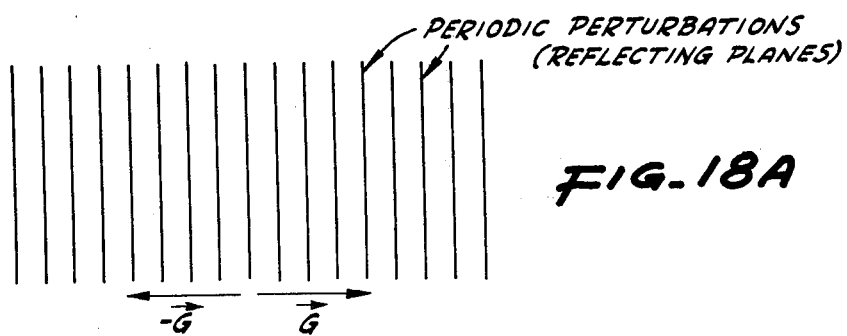
FIGS. 18A, 18B are schematic drawings illustrating equivalent mirror action for a one dimensional distributed feedback structure.
Figure 18B:
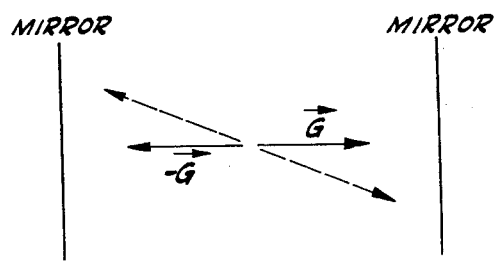

In order to see how practical arrangements can be made for mode locking in thin film lasers, the following observations are made. FIG. 18a shows schematically a thin film DFB laser having a single set of periodic perturbations in the z direction. As mentioned earlier, the perturbations provide periodic reflections in the z direction and thereby serve a function similar to that of mirrors in conventional lasers. Further, the analysis presented in my previously referenced application Ser. No. 296,178 shows that a very high reflectivity can be achieved with periodic structures which far exceeds the reflectivity achievable with mirrors. However, since reflections are possible only in the zi direction for the structure of FIG. 18a, a single set of periodic perturbations behaves somewhat like plane parallel mirrors. As illustrated in FIG. 18b, a set of plane parallel mirrors is basically only marginally stable. Only laser beams propagating in a direction perpendicular to the mirrors (as indicated by $\pm\vec{G}$) will be bounced back and forth in the resonator without suffering diffraction losses. Any beam propagating in a direction away from $\pm\vec{G}$ (as indicated by the dashed arrows) will have very high diffraction losses. Therefore, a DFB laser with a single set of periodic perturbations is unsuitable as plane parallel mirrors are unsuitable in many practical applications of known lasers.

Figure 19A:
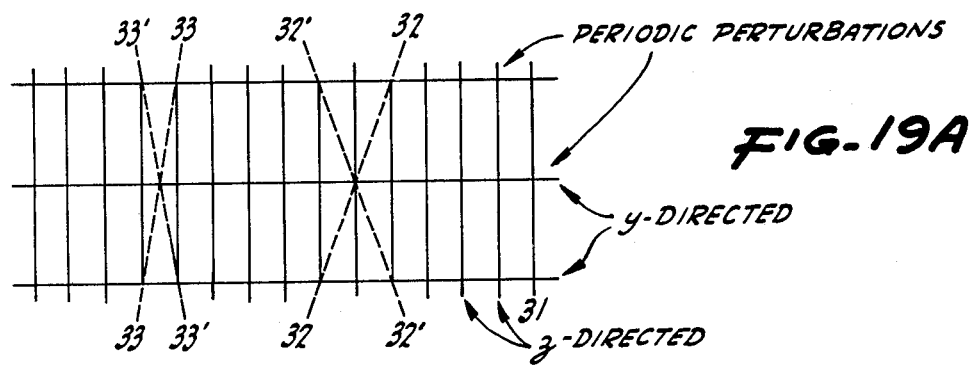
FIGS. 19A and 19B are schematic drawings illustrating the reflecting property of a two dimensional feedback structure constructed in accordance with the present invention.
Figure 19B:
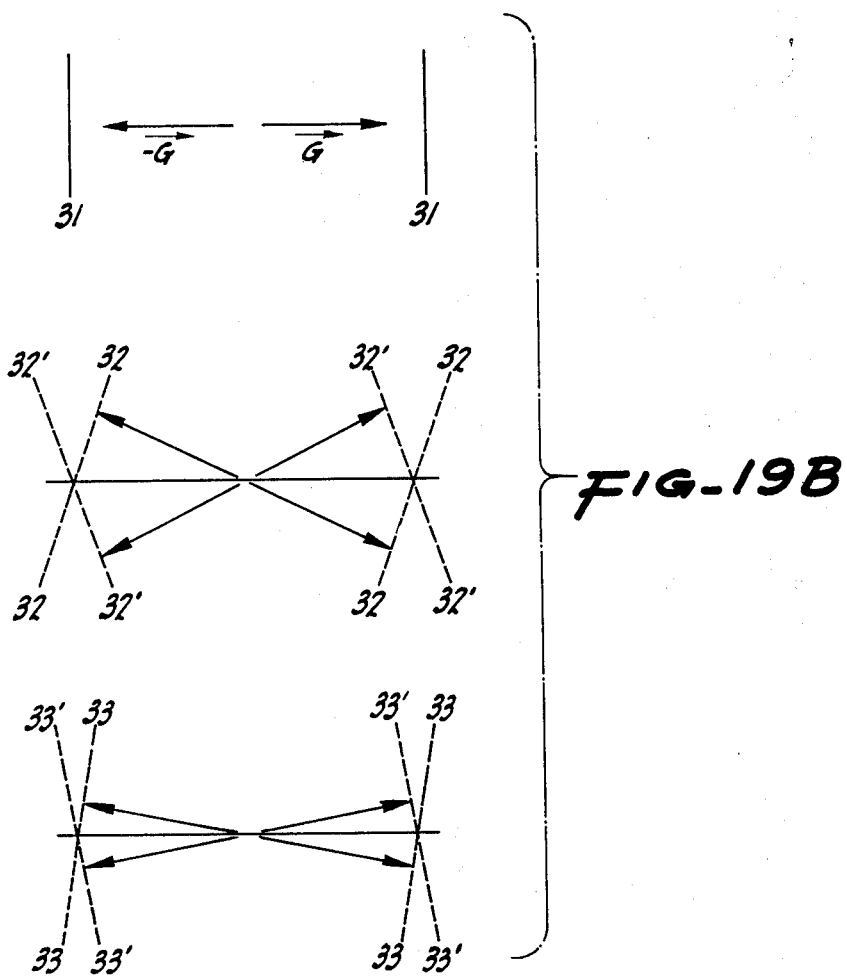

The fact that using two sets of periodic perturbations can overcome the drawback of a single set of periodic perturbations can best be seen from FIGS. 19a and 19b. As shown in FIG. 14a, a DFB laser with two sets of periodic perturbations has, in addition to the reflecting planes 1 as in a DFB laser with a single set of periodic perturbations many other reflecting planes such as those marked by 32, 32', 33 and 33'. A laser beam propagating in a direction perpendicular to any set of the reflecting planes will be bounced back and forth in the resonator without suffering diffraction losses. FIG. 19b shows schematically several configurations in which a laser beam can be reflected back and forth. There are many other possible configurations for reflection which are not shown in FIG. 19b. Therefore, a DFB laser structure with two sets of periodic perturbations provides many stable configurations for reflections to take place, and in that sense behaves in a manner analogous to spherical mirrors or the equivalent so that many transverse modes may oscillate simultaneously.

Figure 20A:
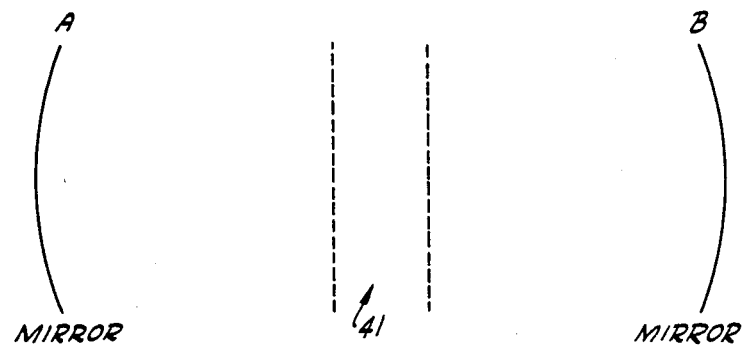
FIG. 20A is a schematic drawing illustrating mode locking for conventional lasers.

FIG. 20a shows schematically one arrangement for mode locking a conventional laser beam. The essential element in the arrangement is an intercavity region 41 in which either the loss or the phase of a laser beam can be modulated. The basic principle of mode locking can easily be found in the literature, and can be briefly stated as follows. If the loss or phase of the intercavity space 41 is modulated by a regular frequency corresponding to the intra-mode spacing, then all the modes are forced to oscillate with a definite phase relationship because laser beams oscillating with a different phase will experience a high loss (or a low gain). The high loss (or low gain) is either a direct result of the loss introduced into the cavity in the case of loss modulation or an indirect result of shifting the wavelength of a laser beam outside the gain profile in the case of phase modulation. The loss or phase modulator can be roughly visualized as a gate which allows the passage of a light beam at regular time intervals. This regular opening of a gain forces all the modes to pass the gate at a definite time interval, thereby regulating the phase of all the laser modes. It should be pointed out that under certain conditions, the nonlinear effects of the laser medium itself may cause a fixed phase relationship to be maintained between the oscillating modes. The phenomenon is known as self-locking. For self-locking, no inter-cavity loss or phase modulator is needed.

Figure 20B:
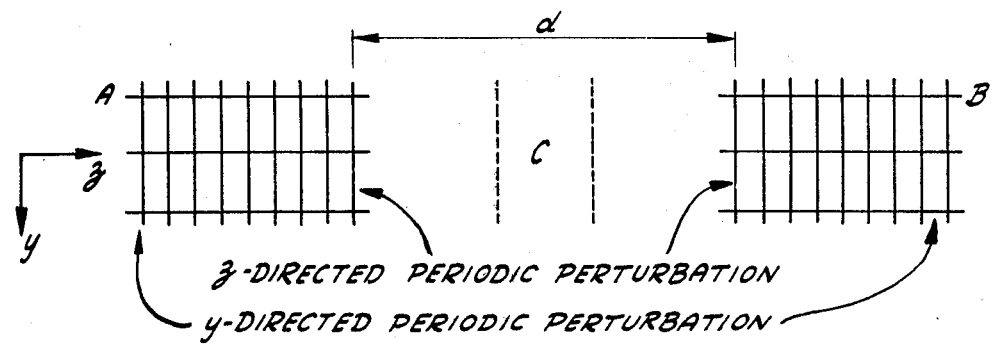
FIGS. 20B, 20C are schematic drawings illustrating mode locking for two dimensional feedback structures constructed in accordance with the present invention.
Figure 20C:
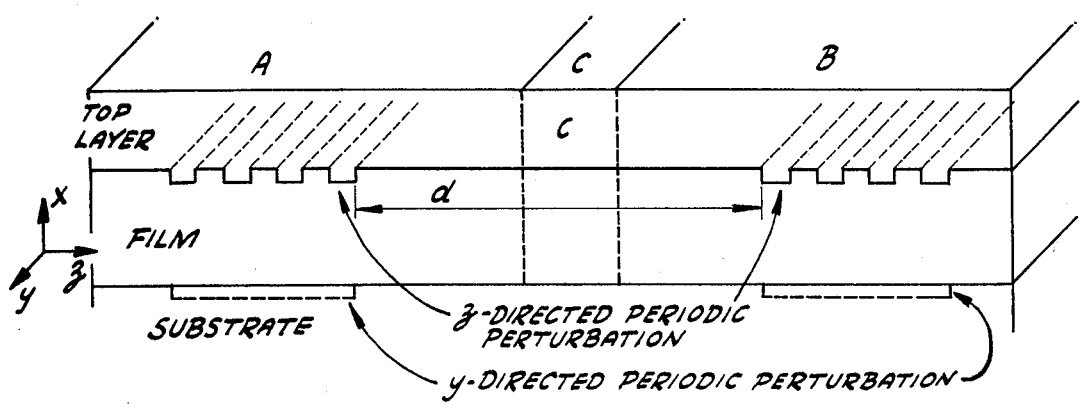

FIG. 20B shows schematically one possible arrangement for mode-locking in thin film DFB lasers, and FIG. 20C shows the actual laser structure for use in the arrangement. The two regions marked by A and B are regions with periodic perturbations, and thus correspond to the two mirrors in the conventional laser (FIG. 20A). The region C is used for internal modulation of the loss or the phase of the laser beam. It should be pointed out that modification of the scheme shown in FIG. 20B and C are possible and may be necessary under certain circumstances. First, in laser media where non-linear effects are sufficient to cause self-locking, the region C is no longer necessary and hence can be eliminated. Second, under certain circumstances it is neither necessary nor desirable to separate the two regions A and B; or in other words, d should be set equal to zero in FIGS. 20B and C. Accordingly to the analysis presented in my previous patent applications Ser. No. 2,296,178, and Ser. No. 331,675, the gain in a DFB laser depends on how far the guided wavelength $\lambda_g = 2\pi/k_z$ is away from the Bragg condition $k_z = N_z G_z/2$. Consider an arrangement in which $d = 0$ and an electric field exists in the region C. The applied electric field modulates the gain in the region C as it changes $\lambda_g$ through the electro-optic effect. Thus, for $d = 0$, modulation of the gain can be used for modelocking. On the other hand, if $d \neq 0$, the phase of a laser beam is modulated by the electric field. Thus, for $d \neq 0$, modulation of the phase can be used for modelocking. Therefore, depending on which modulation scheme is used, the two sets of periodic perturbations can either by separated or be merged into one.

In the discussion presented thus far, the two periodic perturbations are assumed orthogonal. For some application, two periodic perturbations making an oblique angle may be required. Further, under certain circumstances, more than two periodic perturbations may be needed. The main difference between orthogonal and oblique configurations is the intra-mode spacing. For $a_y >> a_z$, an expansion of Eq. (6) shows that the wavelength spacing between $N_y + 1$ and $N_y$ modes is proportional to $(N_y + 1)^2 - N_y^2$. Therefore, the intra-mode spacing $\lambda_{j+1}-\lambda_j$ is not a constant independent of $j = N_y$. However, the difference between $\lambda_{j+1}-\lambda_j$ and $\lambda_j-\lambda_{j-1}$ is proportional to $(N_y+1)^2 - 2N_y^2$ which reduces to a constant independent of $N_y$. The situation is very similar to that existing between the transverse modes in semiconductor hetrojunction lasers. For such cases, the frequency of the loss (or phase) modulator must be so chosen that it corresponds to the wavelength spacing $\lambda_{j+1}+\lambda_{j-1}-2\lambda_j$. Mode locking of these transverse modes involves the combination tone produced by the nonlinearity of the laser medium, and hence is a second-order effect.

For DFB lasers having oblique periodic perturbations, the situation is quite different. FIG. 21a shows an example for which $G_y$ makes an angle $90° - \alpha$ with $G_z$. The wavelength condition for this situation is $$(\frac{2\pi}{\lambda}n_f)^2 = k_x^2 + \frac{1}{4}(N_z G_z + N_y G_y \sin\alpha)^2 + \frac{1}{4}(N_y G_y \cos\alpha)^2 \qquad (8)$$

$$= k_x^2 + (\frac{1}{2}N_z G_z)^2 + (\frac{1}{2}N_y G_y)^2 + \frac{1}{2}N_z N_y G_z G_y \sin\alpha$$

where $G_y = 2\pi/a_y$ and $G_z = 2\pi/a_z$. For $a_y >> a_z$, Eq. (8) can be approximated by $$\frac{2\pi}{\lambda}n_f \simeq [k_x^2 + (N_z \frac{\pi}{a_z})^2 + 2(N_y N_z \frac{\pi}{a_y} \frac{\pi}{a_z}) \sin\alpha]^{1/2} \qquad (9)$$

An expansion of Eq. (9) shows that the intra-mode spacing $\lambda_{j+1}-\lambda_j$ is proportional to $(j + 1) - j = 1$ which is a constant independent of $j = N_y$. Therefore, phase-locking the transverse modes in DFB lasers with oblique periodic perturbations is quite similar to phase-locking the transverse modes in conventional gas lasers. The frequency of the loss (or phase) modulator is so adjusted that it corresponds to the intra-mode spacing $\lambda_{j+1}-\lambda_j$ which is the same for any pair of adjacent modes.

To support a pair of transverse modes with $\pm N_y$ in Eq. (9), it may be necessary that a pair of $\pm\vec{G}_{y'}$ complementary to $\pm\vec{G}_y$ as shown in FIG. 21B be made available. The periodic structure which will provide both $\pm\vec{G}_y$ and $\pm\vec{G}_{y'}$ is schematically shown in FIG. 21C. Besides the set of periodic perturbations in the z direction, there are two other sets of periodic perturbations marked by (I) and (II). The set (I) provides reciprocal-lattice vectors $N_y \vec{G}_y$ whereas the set (II) provides reciprocal-lattice vectors $N_{y'} \vec{G}_{y'}$. FIG. 21D shows the projection of the $\vec{k}$ vector in the yz plane for the transverse mode with $N_y = 1$ (or $N_{y'} = -1$) and $N_z = \pm 1$. and for the transverse mode with $N_y = -1$ (or $N_{y'} = 1$) and $N_z = \pm 1$. If the angle $\alpha$ in FIG. 21C is made equal to zero, then the two situations shown in FIG. 21D become identical. For $\alpha \neq 0$, the degeneracy is removed, and the structure shown in FIG. 21 will split a pair of degenerate modes into two nondegenerate transverse modes with slightly different frequencies. In summary, the main effects of using oblique perturbations are that the wavelength spacing $\lambda_{j+1} - \lambda_j$ between two adjacent modes is independent of the mode number $j = N_y$ and that the number of independent modes is increased almost by a factor of two by the removal of degeneracy. In practical applications, this means that the number of resolvable spots is increased by a factor of two in a scanning laser.

A passive waveguide with two or more sets of periodic perturbations can also be used to perform certain passive device functions such as filtering and modulating a laser beam. (The word "passive" is used to refer to materials, structures, or devices without gain.) The reciprocal-lattice vectors $\vec{G}$ associated with two arbitrary sets of periodic perturbations can be expressed in a general form:

$$\vec{G} = \hat{y}N_y \frac{2\pi}{a_y} + \hat{z}N_z \frac{2\pi}{a_z} \qquad (10)$$

where $N_y$ and $N_z$ are two integers, and $a_y$ and $a_z$ are the periodicity of the perturbation in the $\hat{y}$ and $\hat{z}$ direction, respectively. In general, the two unit vectors $\hat{y}$ and $\hat{z}$ need not be orthogonal; therefore, Eq. (10) is applicable to oblique as well as orthogonal perturbations.

It is well known in the energy-band theory of solids that forbidden-energy gap (stop band) appears in the energy versus $k$ diagram in a periodic lattice. Similarly a laser beam propagating in the $\vec{G}$ direction will see a stop band in a passive periodic waveguide. In a generalized coordinate system, the Bragg condition for collinear interaction is given by $|G| = 2k_{yz}$ as shown in FIGS. 22 where $|G|$ is the magnitude of the $\vec{G}$ vector and $k_{yz}$ is the projection of the wave vector $\vec{k}$ upon the yz plane. Therefore, the center wavelength $\lambda_c$ of the stop band is determined by the Bragg condition $\lambda_g = 4\pi/|G|$ where $\lambda_g = 2\pi/k_{yz}$ is the guided wavelength. Furthermore, the stop band has a finite bandwidth $\Delta\lambda$ which can be predetermined by controlling the depth of the periodic perturbation, for example, the values of $d_y$ and $d_z$ in FIG. 2. A laser beam with a wavelength falling in the stop band will be totally reflected. FIGS. 23A and 23B show schematically a passive waveguide and its transmission characteristic. Depending on the wavelength of an incident beam, the beam will be either reflected back (indicated by the arrow A) or transmitted through (indicated by the arrow B) the waveguide. Obviously, a waveguide with two sets of periodic perturbations can be used as a stop-band filter. When two such waveguides having different and nonoverlapping bands as shown in FIG. 24 are connected in tandem, they can be used as a pass-band filter.

Note that the magnitude of $\vec{G}$ changes as the direction of $\vec{G}$ changes on account of their dependence on $N_y$ and $N_z$ in Eq. (10). Hence, the center wavelength of the stop-band and pass-band filter can be tuned by changing the orientation of $k_{yz}$. This effect can be used for filtering a multi-mode guided laser beam. The transverse modes of a guided laser beam are distinguished from each other by having a different field distribution in the transverse plane. In the chosen coordinate system $y$ and $z$, each transverse mode can be expressed in terms of plane waves having a distinct and different set of values for $k_y$ and $k_z$. Therefore, for each transverse mode, there is a distinct transmission characteristic with different center wavelength for the stop band and/or pass band. If for example, the pass band illustrated in FIG. 24B is designed for a given transverse mode, then the waveguide shown in FIG. 24A can be used to select that particular mode from a multi-mode guided laser beam. It is also possible to use a stop-band filter shown in FIG. 23 in conjunction with a directional coupler which serves to collect the reflected wave. The combination can be used to select a particular transverse mode from a multi-mode guided laser beam by collecting the reflected wave from the directional coupler.

A passive periodic waveguide can be used as a modulator if one set of periodic perturbation is caused by an acoustic wave. Refer to FIG. 23 and consider a situation in which an incident laser beam falls in the stop band when an acoustic wave of a proper wavelength is present. The condition of total reflection can be removed either by turning off the acoustic field or by changing the acoustic wavelength which affects the value of $a_y$ in Eq. (10). Therefore, digital modulation of the reflected wave (indicated by the arrow A in FIG. 23A) or the transmitted wave (indicated by the arrow B in FIG. 23A) is possible with an acoustic wave by switching a periodic waveguide into and out of a totally reflecting situation.

In summary, the main features for using periodic perturbations in two or more directions in the plane of the film are the following. (1) Directionality: The output of the laser will come out as a linear beam, projectable as a dot on an intersecting plane because all the three components of the wave vector $\vec{k}$ are specified. The direction of the outcoming beam is specified by two angles — $\theta$ in the plane containing the $x$ axis and $\phi$ in the $yz$ plane. In a one-directional DFB laser, the value of $\phi$ is unspecified. (2) Tunability: The laser wavelength is tunable either by selecting a different set of $N_y$ and $N_z$ in Eq. (6) with fixed $a_y$ and $a_z$ or by varying $a_y$ or $a_z$ in Eq. (6) with fixed $N_y$ and $N_z$. (3) Spectral purity: Because of the additional selection in $k_y$, the output of each laser mode is expected to have a spectral purity (narrow wavelength bandwidth) far better than that achievable with a single set of periodic perturbations in one direction. (4) Multi-channel operation: Because of the availability of many reciprocal lattice vectors for distributed feedback, several transverse modes with different $N_y$'s in Eq. (6) may be made to lase simultaneously. Each mode will have a distinct wavelength, and when coupled out from the film either through a prism coupler or through a grating coupler, each mode will have a distinct direction (a distinct set of $\theta$ and $\phi$). These features make multi-chanel operation of a thin-film laser possible. (5) Mode-locking possibility and scanning laser: Simultaneous lasing of many modes provides the possibility for mode-locking. If a proper phase relationship between the modes is maintained either through self-locking or by an applied field through loss or phase modulation, a laser pulse can be produced which travels not only in time space but also in dimensional space. This provides the possibility for a scanning laser which sends out output in certain directions at specific instances. This possibility is extremely useful for communication purposes and for information storage and read-out purposes. Mode-locking also provides the possibility of getting a very strong pulse, much stronger than the pulse obtainable from a one-directional DFB laser, because the fields from many different modes are added together constructively. (6) Flexibility: For laser materials with narrow emission bands, it is absolutely essential to have an exact control of the periodicity of a one-directional waveguide structure. In DFB lasers with periodic perturbations in two or more directions it is possible to make $a_y >> a_z$ and use the term $(N_y\pi/a_z)^2$ in Eq. (6) as a fine tuning to get to the Bragg wavelength. (7) Selectivity: A two-dimensional passive device (such as a filter, a modulator, or a beam deflector) is expected to have a better frequency selectivity than a corresponding one-dimensional device because all the three components of the k vector are specified for a given mode of wave propagation in a two-dimensional periodic waveguide.

We claim:

1. A method for forming a thin film optical device including the steps of disposing an upper and lower boundary layers in optical contact with a thin film optical waveguide, imposing fixed perturbations onto one of said boundary layers in regions thereof which are interacted with upon propagation of light in said waveguide, and imposing variable perturbation in the other of said boundary layers for the purpose of varying the frequency response of said device.

2. A laser comprising an optical waveguide defining a guided wavelength for propagating wave of light at a predetermined frequency, said waveguide having a predetermined optical index of refraction and made of a material transparent to light of said predetermined frequency, means defining at least one boundary layer adjacent to said waveguide and in such proximity that the propagating wave for light at said predetermined frequency extends both within said waveguide and into said boundary layer, said boundary layer having one or more indices of refraction at least a portion of which is less than the index of refraction of said waveguide, one of said waveguide or boundary layers being a laser active material which exhibits gain with respect to light at said predetermined frequency, first means associated with one of said boundary layers, said waveguide, or the interface between said boundary layer and said waveguide for forming a periodic variation of the index of refraction thereof in a first predetermined direction, said periodic variation being arranged for causing a spatial variation of said index of refraction between two values which repeat in a regular pattern of a first predetermined periodicity $a_y$, second means associated with one of said boundary layer, said waveguide on the interface of said boundary layer and said waveguide for forming a periodic variation of the index of refraction thereof in a second predetermined direction, said second periodic variation of said index of refraction between two values which repeat in regular pattern of a second predetermined periodicity $a_z$ wherein said periodicities $a_y$ and $a_z$ are solutions to an equation of the general form $$\left(\frac{2\pi}{\lambda_g}\right)^2 = F\left(\frac{N_y}{a_y}, \frac{N_z}{a_z}\right)$$

where $\lambda_g$ is the guided wavelength $N_y$ and $N_z$ are integers and the ratios $$\frac{N_y}{a_y}, \frac{N_z}{a_z}$$

define an intersection in reciprocal lattice space for a given waveguide structure.

3. A thin film optical device comprising an optical waveguide having boundary surfaces and defining a guided wavelength for propagating wave of light at a predetermined frequency, said waveguide having a predetermined optical index of refraction and made of a material transparent to light of said predetermined frequency, means defining at least one boundary layer adjacent to said waveguide and in such proximity that the propagating wave for light at said predetermined frequency extends both within said waveguide and into said boundary layer, said boundary layer having one or more indices of refraction at least a portion of which is less than the index of refraction of said waveguide, perturbation means associated with said boundary layer, said waveguide or the interface between said boundary layer and said waveguide for forming a periodic variation of an optical parameter thereof in a first predetermined direction, said periodic variation being arranged for causing a spatial variation of said optical parameter between two values which repeat in a regular pattern of a first predetermined periodicity $a_y$, said perturbation means further forming a second periodic variation of an optical parameter thereof in a second predetermined direction, said second periodic variation of said optical parameter between two values which repeat in regular pattern of a second predetermined periodicity $a_z$, one of said boundary layers and said waveguide being made of laser active material, and means for pumping said laser active material.

* * * * *